(12) United States Patent
Koelle et al.

(10) Patent No.: US 7,578,710 B2
(45) Date of Patent: Aug. 25, 2009

(54) ELECTRICAL DEVICE

(75) Inventors: Gerhard Koelle, Wiernsheim (DE); Stephan Mazingue-Desailly, Ludwigsburg (DE); Alexander Lerich, Schwieberdingen (DE); Roland Hellwig, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/893,013

(22) Filed: Aug. 13, 2007

(65) Prior Publication Data

US 2008/0050960 A1 Feb. 28, 2008

(51) Int. Cl.
*H01R 4/42* (2006.01)

(52) U.S. Cl. ...................................... 439/762

(58) Field of Classification Search ......... 439/754–774; 307/10.7; 324/177
See application file for complete search history.

(56) References Cited

U.S. PATENT DOCUMENTS

| | | | | |
|---|---|---|---|---|
| 4,237,198 A * | 12/1980 | Eby et al. | | 429/93 |
| 4,572,878 A * | 2/1986 | Daugherty | | 429/62 |
| 4,675,255 A * | 6/1987 | Pfeifer et al. | | 429/92 |
| 5,343,757 A * | 9/1994 | Tate | | 73/724 |
| 5,645,448 A * | 7/1997 | Hill | | 439/522 |
| 6,218,805 B1 * | 4/2001 | Melcher | | 320/105 |
| 6,326,776 B1 * | 12/2001 | Yoshiuchi et al. | | 324/156 |
| 6,347,958 B1 * | 2/2002 | Tsai | | 439/488 |
| 6,544,078 B2 * | 4/2003 | Palmisano et al. | | 439/762 |
| 6,551,147 B2 * | 4/2003 | Wakata et al. | | 439/754 |
| 6,554,649 B2 * | 4/2003 | Pade | | 439/620.17 |
| 6,588,931 B2 * | 7/2003 | Betzner et al. | | 374/185 |
| 6,652,293 B2 * | 11/2003 | Fuchs et al. | | 439/76.1 |
| 6,683,450 B2 * | 1/2004 | Rick et al. | | 324/173 |
| 6,787,935 B2 * | 9/2004 | Heim | | 307/10.1 |
| 6,808,841 B2 * | 10/2004 | Wakata et al. | | 429/91 |
| 7,258,576 B2 * | 8/2007 | Ohnishi | | 439/620.01 |
| 7,344,420 B2 * | 3/2008 | Tokunaga | | 439/754 |
| 7,381,101 B2 * | 6/2008 | Roset et al. | | 439/754 |
| 2003/0054693 A1 * | 3/2003 | Fuchs et al. | | 439/620 |
| 2003/0057770 A1 * | 3/2003 | Heim | | 307/9.1 |
| 2004/0048142 A1 * | 3/2004 | Marusak et al. | | 429/61 |
| 2005/0176282 A1 * | 8/2005 | Hirthammer | | 439/217 |
| 2005/0250371 A1 * | 11/2005 | Koga | | 439/395 |
| 2006/0014404 A1 * | 1/2006 | Iwamoto et al. | | 439/76.2 |
| 2006/0057899 A1 * | 3/2006 | Tokunaga | | 439/754 |
| 2006/0076466 A1 * | 4/2006 | Serra | | 248/200 |
| 2006/0077643 A1 * | 4/2006 | Mayuzumi et al. | | 361/753 |
| 2006/0128199 A1 * | 6/2006 | Hedtke | | 439/320 |
| 2006/0134937 A1 * | 6/2006 | Mayuzumi et al. | | 439/61 |
| 2006/0171127 A1 * | 8/2006 | Kadoya et al. | | 361/752 |
| 2006/0258185 A1 * | 11/2006 | Yagi et al. | | 439/76.2 |
| 2007/0010138 A1 * | 1/2007 | Ohnishi | | 439/736 |

(Continued)

FOREIGN PATENT DOCUMENTS

DE 19961311 7/2001

(Continued)

*Primary Examiner*—Ross N Gushi
(74) *Attorney, Agent, or Firm*—Kenyon & Kenyon LLP

(57) ABSTRACT

An electrical device, in particular a device for determining electrical variables (battery sensor), is provided which includes a connecting region between the part of the device which determines electrical variables and an attachment point. The connecting region has an essentially central axis. The device has a conductive interface between two conductor sections, the interface being offset from the central axis.

10 Claims, 1 Drawing Sheet

U.S. PATENT DOCUMENTS

2007/0212912 A1* 9/2007 Osborne et al. ............. 439/180
2008/0038942 A1* 2/2008 Gordon et al. ............. 439/76.2
2008/0050960 A1* 2/2008 Koelle et al. ................ 439/345
2008/0050985 A1* 2/2008 Roset et al. ................. 439/754

FOREIGN PATENT DOCUMENTS

| DE | 10347111 | 5/2005 |
| DE | 102004006298 | 9/2005 |
| DE | 10 2004 049 153 | 4/2006 |
| WO | WO 99/54744 | 10/1999 |
| WO | WO 2006/048232 | 5/2006 |

* cited by examiner

ELECTRICAL DEVICE

FIELD OF THE INVENTION

The present invention relates to an electrical device, in particular a device for determining electrical variables.

BACKGROUND INFORMATION

Unexamined German Patent Application No. 10 2004 049 153 is cited as an example thereof. In such a design it is disadvantageous that vibrational loads or tensile loads on the main conductor may result in high material stresses in the connecting region between the main conductor and the terminal.

SUMMARY OF THE INVENTION

The electrical device according to the present invention, in particular a device for determining electrical variables, such as a battery sensor, for example, has the advantage that space is provided for affixing an additional attachment point which thus greatly reduces the torque load in the connecting region between the attachment point and the conductors. The service life is thus improved.

If on the other side of the central axis viewed from the interface an additional connecting region is present, which connects one of the conductor sections to the attachment point, the attachment, in particular of the second conductor, and thus the torque load in the interface, is greatly reduced.

One simple possibility for connecting the second conductor section to the attachment point is to select a form fit. This is the case in particular when the form fit is provided by a molded part which encloses two conductor sections, namely, the first and the second conductor sections. It is advantageous when the molded part has the shape of two closed interconnected rings (figure eight shape). The transmittable restraining forces are particularly high. Secure insulation between the two conductor sections also results when the connection point at which the two rings are joined insulates the two conductor sections from each other.

The molded part is advantageously a part of the housing, and therefore is a housing section.

If the first and second conductor sections are connected to one another at the interface, i.e., integrally joined, the ease of manufacture of both conductor sections as such, and also of the force transmission points between the second conductor and the attachment point, is improved.

DETAILED DESCRIPTION

Figures 1, 2:
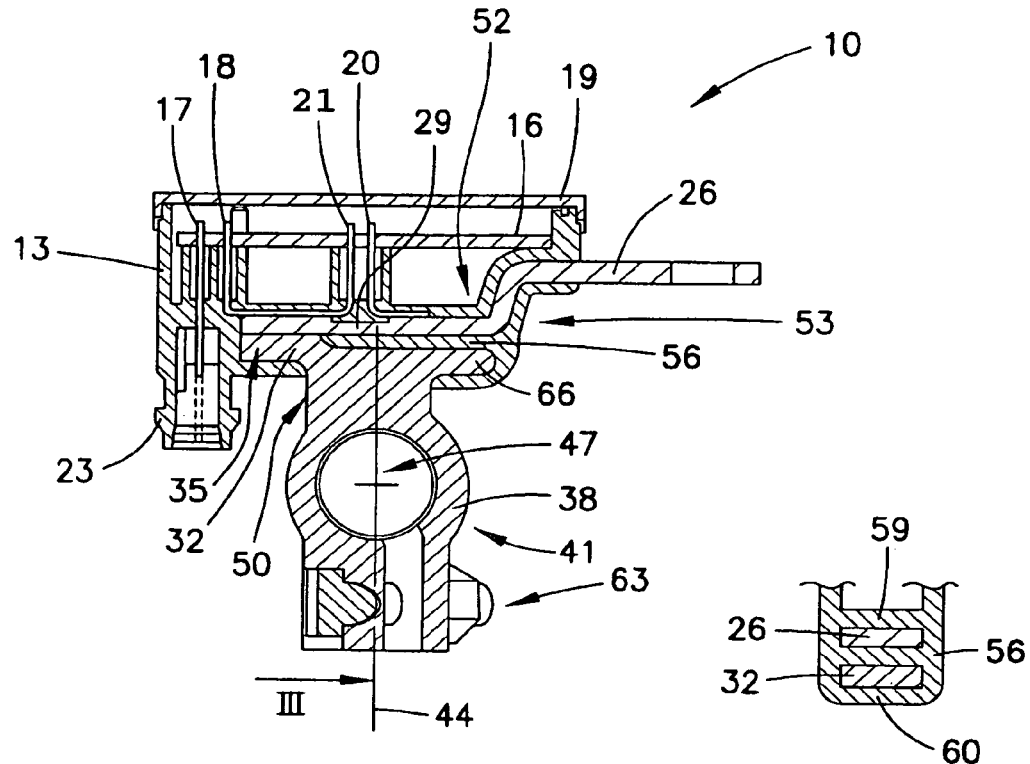
FIG. 1 shows a longitudinal section of the electrical device.
FIG. 2 shows a partial section of the electrical device from FIG. 1.

FIG. 1 shows a longitudinal section of electrical device 10. The electrical device includes a housing 13 in which a printed circuit board 16 is situated. Housing 13 is closed by a cover 19. Housing 13 is made of plastic, and is manufactured by injection molding. The material of this housing 13 includes objects that may be different such as, for example, various pins 17, 18, 20, and 21. Pin 17 allows a connection to the enclosure for housing 13, and is a part of a plug 23. Pins 18, 20, and 21 are connected to a conductor, in this case referred to as second conductor section 26. The so-called battery current flowing through second conductor section 26 may be determined with the aid of these pins 18, 20, and 21. For this purpose, second conductor section 26 has a so-called shunt section 29. Pins 20 and 21 enclose shunt section 29, which has the usual characteristic of having a particularly constant resistance under various operating conditions. This characteristic allows the voltage drop over shunt section 29 to be determined relatively accurately, thereby allowing a conclusion to be drawn directly or indirectly concerning the charge state of a connected battery. The second conductor section extends for the most part inside housing 13. Second conductor section 26 is connected to a first conductor section 32. This electrical connection is established in an interface 35. This interface 35 is the transition point between the first conductor section and the second conductor section. The first conductor section may be designed as one piece with a terminal 38 which is a part of an attachment point 41.

A central axis 44 may pass through attachment point 41. If attachment point 41, which in this case is designed as a terminal 38, is essentially circular and also has an essentially circular central opening having a center point 47, this central axis 44 is designed to pass through this center point 47. In addition, this central axis 44 is designed to pass essentially through the center of a connecting region 50 (area center of gravity). This connecting region 50 establishes the connection between housing 13 and attachment point 41. Interface 35 is offset from central axis 44, as shown in FIG. 1. An electrical device 10, in particular a device for determining electrical variables, a battery sensor, for example, is thus provided which has a connecting region 50 between the part of the device which determines electrical variables and an attachment point 41. Connecting region 50 has an essentially central axis 44. In addition, an interface 35 is present between a first conductor section 32 and a second conductor section 26, at which interface the two conductor sections are connected to each other in a conducting manner. Interface 35 is offset from central axis 44. In other words, central axis 44 does not pass through interface 35.

Located on the other side of central axis 44 viewed from interface 35 is additional connecting region 52 which joins second conductor section 26 to attachment point 41. This second conductor section 26 is connected to attachment point 41 via at least one form fit 53. This form fit 53 is provided by a molded part 56 which encloses both conductor sections 32 and 26 (also see FIG. 2). The connecting region of molded part 56 has the shape of two closed interconnected rings (figure eight shape). Both conductor sections 32 and 26 are insulated from one another at the connecting point at which rings 59 and 60 are joined together. Molded part 56 is a housing section of housing 13.

The component which includes attachment point 41 to terminal 38 and to conductor section 32 has the approximate shape of a hammer. The hammer-like shape results from the fact that connecting region 50 and terminal 38 as well as bracing region 63 are aligned practically in a straight line, this straight line being defined by previously mentioned central axis 44. Using the analogy of a hammer, bracing section 63, attachment point 41, and connecting region 50 essentially represent the handle, which at one end transitions into a contour which essentially corresponds to the head of a hammer. Thus, in the present case material projections extend from connecting region 50 in two opposite directions. The first material projection indicates main surface 35. The other material projection 66 having the design of a butt end makes form fit 53 possible.

Conductor sections 26 and 32 are connected to one another at interface 35. An integral joint is selected as the joining technique. Welding or soldering, for example, may be considered for this purpose.

Attachment point 41 is used to hold device 10 stationary, this attachment point 41 being designed such that it is suitable for holding device 10 on a customary battery terminal 70 of a battery 71 in a motor vehicle. Customary battery terminal 70 has an essentially cylindrical or truncated cone shape, as shown in FIG. 3*c*.

Figures 3A, 3B, 3C:
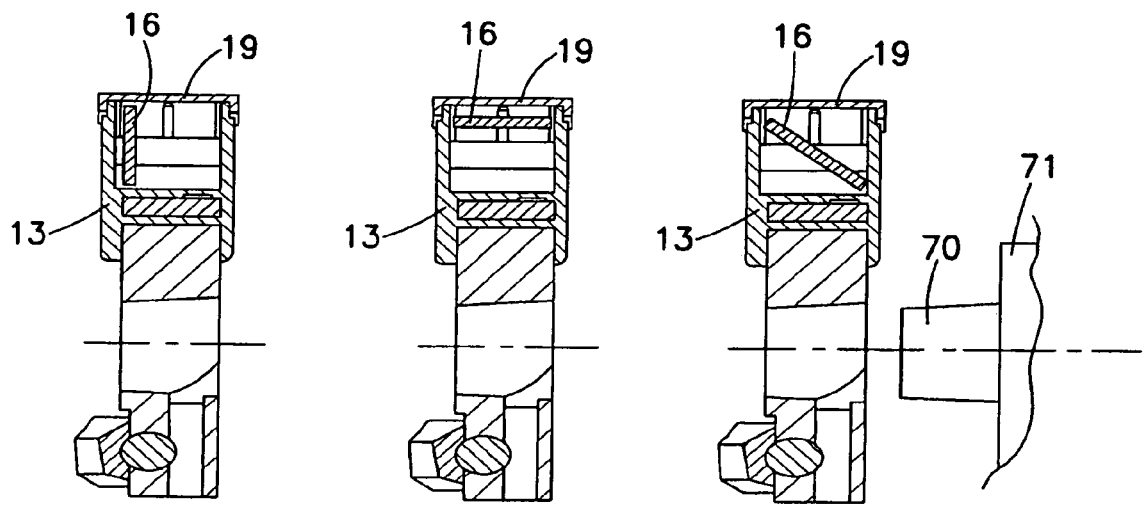
FIGS. 3a, 3b, and 3c each show partial sections of the electrical device; in this case the printed circuit board may assume various positions.

As illustrated in FIGS. 3*a*, 3*b*, and 3*c*, printed circuit board 16 may be positioned in housing 13 in various ways. Thus, for example, printed circuit board 16 may be aligned perpendicular to the section of second conductor section 26 which supports shunt section 29. As shown in FIGS. 1 and 3*b*, printed circuit board 16 may also be aligned parallel to the above-mentioned section. If necessary, according to FIG. 3*c*, printed circuit board 16 may also be positioned at an angle inside the housing.

The overall manufacturing method may be described as follows. First, first conductor section 32 and second conductor section 26 are joined together by an integral joint or an integral joining method such as ultrasonic welding or hard soldering, for example. Pins 18, 20, and 21 are then attached to second conductor section 26. In the exemplary embodiment these pins 18, 20, and 21 are attached by welding. Alternative attachment methods are soldering, or also pressing straight pins 18, 20, and 21 into openings in second conductor section 26. Other designs of the signal lines on second conductor section 26 are also possible. Thus, for example, parts of second conductor section 26 could also be shaped to form the corresponding connecting elements for the signal lines. A stamped and bent part could also be provided as a connecting element for the shunt. All components, i.e., first conductor section 32, second conductor section 26, and pins 18, 20, and 21 as well as additional pin 17 are then extrusion coated with plastic to form a housing 13 for accommodating the electronic system (printed circuit board 16). As a result of their dimensions and shape, the geometries of the signal lines, plug lines (pins 17, 18, 20, and 21), and second conductor section 26 allow extrusion coating tightly close to the inside of the housing. The ends of the signal lines, i.e., pins 17, 18, 20, and 21, on the housing side are appropriately designed for the connection to printed circuit board 16 in such a way that they form not only the electrical connection to the printed circuit board, but at the same time also provide the mechanical attachment of printed circuit board 16. It is possible to provide not only the two signal lines (pins 20 and 21) necessary for measuring the shunt voltage, but also to provide more than one signal line on each side of shunt 29. At least one of these multiple signal lines on each side of the shunt is used for measuring the shunt voltage. Designs of the signal line on the connecting side of the electronic system may be provided in such a way that the sensor lines (pins 17, 18, 20, and 21) are pressed or soldered into corresponding recesses in printed circuit board 16. Alternatively, the corresponding contacts could also be soldered or welded onto the printed circuit board. Cover 19 which is used for protecting the electronic system from external influences may be laser welded, ultrasonically welded, or glued to plastic housing 13. Alternatively, cover 19 may be attached to housing 13 via an auxiliary seal and locking clips (snap hooks).

What is claimed is:

1. An electrical device for determining electrical variables, comprising:
    an electronic circuit adapted to determine the electrical variables;
    a first conductor section;
    a second conductor section mechanically coupled to the first conductor section via a single conductive interface that provides an electrical connection between the first conductor section and the circuit;
    an attachment point adapted to mechanically stabilize the device by attaching the device to an external object; and
    a single, solid connecting region in which the interface is located, wherein the single, solid connecting region:
        connects at a first end to the attachment point,
        connects at a second end opposite the first end to a housing of the device,
        extends between the circuit and the attachment point, and
        includes a substantially central axis passing through a center point thereof, the central axis further passing through a center point of the attachment point, wherein the interface is offset in a first direction along a plane perpendicular to the central axis and the second conductor extends away from the central axis, in a second direction along the plane, opposite the first direction.

2. The electrical device according to claim 1, further comprising an additional connecting region offset in the second direction along the plane, the additional connecting region connecting the second conductor section to the attachment point.

3. The electrical device according to claim 2, wherein the second conductor section is connected to the attachment point via at least one form fit.

4. The electrical device according to claim 3, wherein the form fit includes a molded part which encloses both conductor sections.

5. The electrical device according to claim 4, wherein the molded part has a shape of two closed interconnected rings.

6. The electrical device according to claim 5, wherein a connection point at which the two rings are joined insulates both conductor sections from each other.

7. The electrical device according to claim 4, wherein the molded part is a housing section.

8. The electrical device according to claim 1, wherein the two conductor sections are integrally joined to each other at the interface.

9. The electrical device according to claim 1, wherein the attachment point holds the device stationary.

10. The electrical device according to claim 1, wherein the attachment point is adapted to hold the device on a customary battery terminal of a battery in a motor vehicle.

* * * * *